US011689095B2

(12) United States Patent
Liu et al.

(10) Patent No.: US 11,689,095 B2
(45) Date of Patent: Jun. 27, 2023

(54) ADAPTIVE GATE DRIVE FOR A POWER SWITCH TRANSISTOR IN A SWITCHING POWER CONVERTER

(71) Applicant: DIALOG SEMICONDUCTOR INC., Campbell, CA (US)

(72) Inventors: Wenduo Liu, Campbell, CA (US); Huangxuan Gong, Campbell, CA (US); Vijay Kanagala, Campbell, CA (US); Hien Bui, Campbell, CA (US)

(73) Assignee: Dialog Semiconductor Inc., Campbell, CA (US)

( * ) Notice: Subject to any disclaimer, the term of this patent is extended or adjusted under 35 U.S.C. 154(b) by 244 days.

(21) Appl. No.: 17/145,186

(22) Filed: Jan. 8, 2021

(65) Prior Publication Data

US 2022/0224217 A1    Jul. 14, 2022

(51) Int. Cl.
*H02M 1/08* (2006.01)
*H02M 1/44* (2007.01)
*H03K 17/042* (2006.01)
*H02M 3/335* (2006.01)

(52) U.S. Cl.
CPC .............. *H02M 1/08* (2013.01); *H02M 1/44* (2013.01); *H02M 3/33592* (2013.01); *H03K 17/04206* (2013.01)

(58) Field of Classification Search
CPC ...... H02M 1/08; H02M 1/44; H02M 3/33592; H02M 1/0029; H03K 17/04206
See application file for complete search history.

(56) References Cited

U.S. PATENT DOCUMENTS

| | | | | |
|---|---|---|---|---|
| 4,471,418 A | * | 9/1984 | Tuma | H02M 3/33507 323/299 |
| 7,057,907 B2 | * | 6/2006 | Oh | H02M 3/33507 363/21.01 |
| 8,576,586 B2 | * | 11/2013 | Zheng | H02M 3/33507 363/21.13 |
| 9,112,498 B2 | | 8/2015 | Li et al. | |
| 2008/0180130 A1 | * | 7/2008 | Hayami | H04L 25/0278 326/30 |
| 2022/0200459 A1 | * | 6/2022 | Duvnjak | H03K 17/102 |

FOREIGN PATENT DOCUMENTS

KR        10-1345078        5/2013

* cited by examiner

*Primary Examiner* — Kyle J Moody
(74) *Attorney, Agent, or Firm* — Haynes and Boone, LLP

(57) ABSTRACT

A gate drive control circuit is provided that charges a gate voltage of a power switch transistor during a power switch transistor on-time period. During a first portion of the on-time period, the gate drive control circuit charges the gate voltage through a relatively-low resistance. During a second portion of the on-time period, the gate drive control circuit charges the gate voltage through a relatively-high resistance. Finally, during a third portion of the on-time period, the gate drive control circuit charges the gate voltage through another relatively-low resistance.

18 Claims, 5 Drawing Sheets

ADAPTIVE GATE DRIVE FOR A POWER SWITCH TRANSISTOR IN A SWITCHING POWER CONVERTER

TECHNICAL FIELD

This application relates to switching power converters, and more particularly to a switching power converter with an adaptive gate drive for a power switch transistor.

BACKGROUND

During operation of a flyback converter, a primary-side controller controls the switching of a power switch metal-oxide-semiconductor field-effect transistor (MOSFET) connected to a primary winding of a transformer. The power switch transistor is typically an NMOS transistor having a drain connected to the primary winding and a source coupled to ground. Prior to the power switch being switched on, the drain is charged to (or above) the input voltage to the primary winding. The input voltage is rectified from the AC mains and can thus be more than 100 V depending upon the AC mains cycling. With the power switch transistor being fully switched on, the drain is grounded. The drain of the power switch transistor is thus subjected to a relatively high rate of voltage change (dV/dt) during the power switch transistor turn on. This rapid change in the drain voltage of the power switch transistor may lead to an undesirable level of electromagnetic interference (EMI).

To reduce the EMI from the power switch cycling, it is conventional to drive the power switch transistor on through a relatively complicated drive circuit that includes a high-voltage Miller capacitor, a bipolar junction transistor, a diode, and external resistors. These drive circuit components increase cost and occupy circuit board space. To avoid this cost and complication, it is known to drive the power switch transistor with a simplified gate driver having a turn-on period or procedure divided into two sections having different drive resistances. During a first section of the turn-on period, the gate driver drives the gate of the power switch transistor through a relatively-high drive resistance to reduce the dV/dt rate of change of the drain-to-source voltage across the power switch transistor. Once the drain voltage has dropped sufficiently, the gate driver then drives the gate of the power switch transistor through a relatively-low drive resistance to quickly increase the gate voltage and fully switch on the power switch transistor.

A timing between the high-resistance drive and the low-resistance drive of the power switch transistor gate occurs according to an output signal from a comparator. The comparator may compare the drain-to-source voltage or the gate-to-source voltage of the power switch transistor to a threshold voltage. An example gate driver 100 is shown in FIG. 1. Gate driver 100 charges and discharges the gate of a power switch transistor M1 connected to a primary winding L1 of a transformer to control the cycling of the power switch transistor M1. A gate driver control circuit 105 adjusts the drive resistance used to drive the gate voltage of the power switch transistor M1 responsive to a comparator 110 that compares the gate voltage of the power switch transistor M1 to a threshold voltage. The gate driver control circuit 105 begins the on-time period for the power switch transistor M1 by charging its gate through a relatively-high drive impedance. The gate voltage of the power switch transistor eventually rises above the threshold voltage to comparator 110 so that an output signal from comparator 110 is asserted. As used herein, a binary signal is deemed to be "asserted" when the signal is logically true, regardless of whether the logical convention is logic high or logic low. In response to the assertion of the comparator output signal, gate driver control circuit 105 charges the gate of the power switch transistor through a relatively low drive impedance. This low drive impedance is used for the remainder of the on-time period for the power switch transistor.

Although gate driver 100 avoids the complexities and cost of the Miller capacitor approach, the use of such a gate driver results in an undesirable delay or duration for the turn-on portion of the power switch transistor on-time period. This long turn-on time reduces the effective duty cycle, which lowers efficiency under heavy loads. In addition, the transition time between the high-impedance drive portion and the low-impedance drive portion is not optimal, which again undesirably lengthens the turn-on time.

Accordingly, there is a need in the art for switching power converter drive circuits with reduced turn-on times for the power switch transistor yet still providing a sufficiently-low level of EMI.

SUMMARY

In accordance with a first aspect of the disclosure, a drive control circuit for a power switch transistor in a switching power converter is provided that includes: a gate drive circuit configured to drive a gate voltage of the power switch transistor through a variable gate drive resistance; and an adaptive drive control circuit configured to command the gate drive circuit to use a first gate drive resistance during a first portion of a power switch transistor on-time period, a second gate drive resistance during a second portion of the power switch transistor on-time period, and a third gate drive resistance during a third portion of the power switch transistor on-time period.

In accordance with a second aspect of the disclosure, a method of adapting the gate drive resistance for a power switch transistor in a switching power converter is provided that includes: during an initial portion of a power switch transistor on-time period while a gate voltage of the power switch transistor is less than a first threshold voltage, charging a gate of the power switch transistor through a first resistance; initiating a timing of a maximum delay period responsive to the gate voltage of the power switch transistor being greater than the first threshold voltage; during a second portion of the power switch transistor on-time period prior to an expiration of the maximum delay period, charging the gate of the power switch transistor through a second resistance.

In accordance with a third aspect of the disclosure, a switching power converter is provided that includes: an inductor; a power switch transistor coupled to the inductor; and a gate drive control circuit configured to: charge a gate of the power switch transistor through a first resistance during a first portion of an on-time period, charge the gate of the power switch transistor through a second resistance during a second portion of the on-time period, and charge the gate of the power switch transistor through a third resistance during a third portion of the on-time period.

These and other aspects of the invention will become more fully understood upon a review of the detailed description, which follows. Other aspects, features, and embodiments will become apparent to those of ordinary skill in the art, upon reviewing the following description of specific, exemplary embodiments in conjunction with the accompanying figures. While features may be discussed relative to certain embodiments and figures below, all embodiments can include one or more of the advantageous features discussed herein. In other words, while one or more embodiments may be discussed as having certain advantageous features, one or more of such features may also be used in accordance with the various embodiments discussed herein. In similar fashion, while exemplary embodiments may be discussed below as device, system, or method embodiments it should be understood that such exemplary embodiments can be implemented in various devices, systems, and methods.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1:
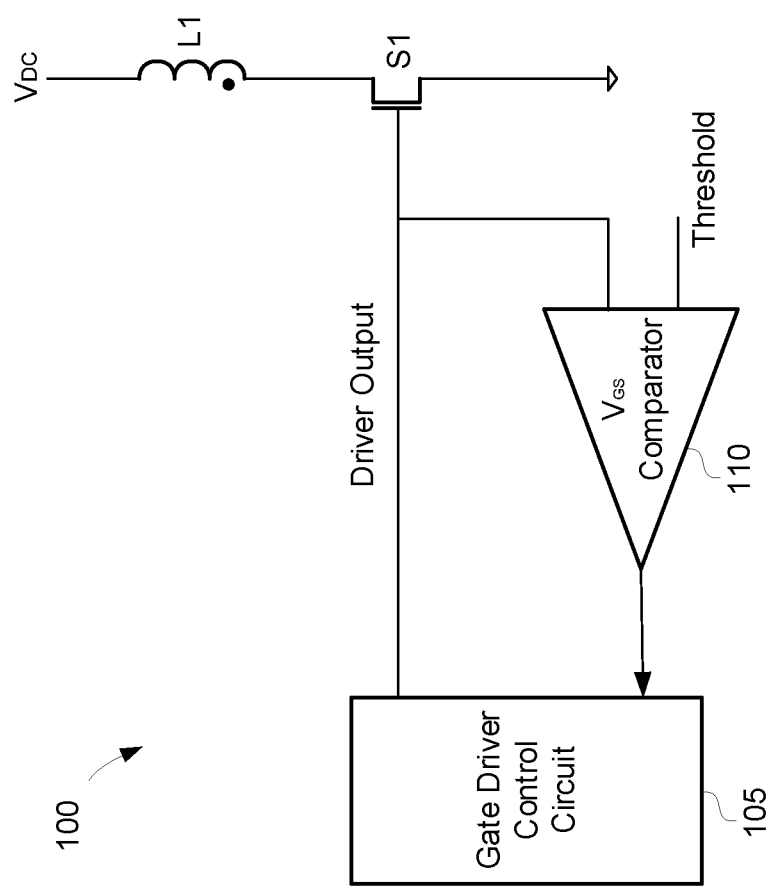
FIG. 1 illustrates a conventional drive circuit for a power switch transistor in a switching power converter.
Figure 2:
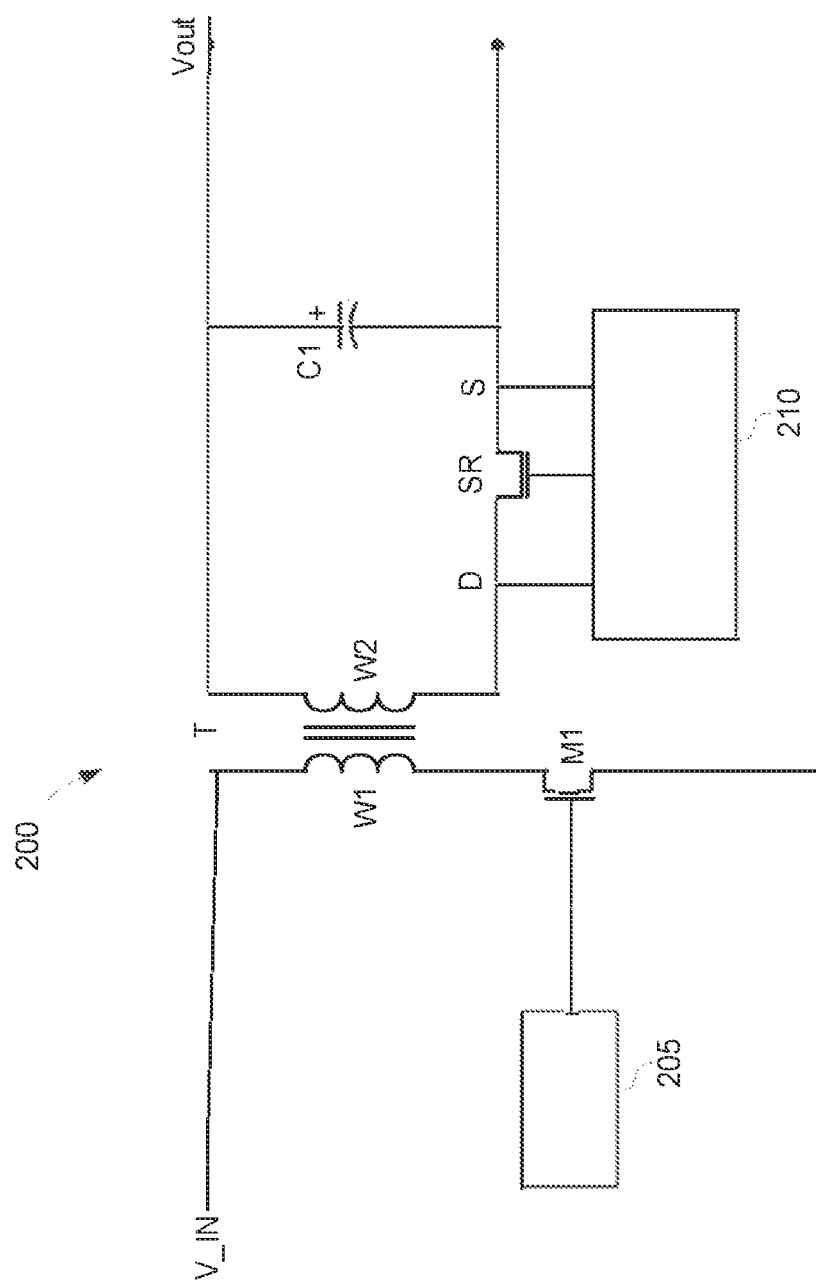
FIG. 2 illustrates a flyback converter with an improved drive circuit in accordance with an aspect of the disclosure.

An improved drive control circuit is provided for a switching power converter. The following discussion will be directed to flyback converter implementations, but it will be appreciated that the improved drive control circuit disclosed herein may be advantageously employed for the driving of any suitable power switch transistor such as in a buck or a boost converter. An example flyback converter 200 is shown in FIG. 2 that includes an improved drive control circuit 205. Flyback converter 200 includes a transformer T having a primary winding W1 and a secondary winding W2. During operation, drive control circuit 205 charges the gate of a power switch transistor M1 connected to the primary winding W1 to switch on the power switch transistor M1 for an on-time period. The primary winding W1 also connects to an input voltage rail carrying a rectified input voltage (V_IN). When the power switch transistor M1 is cycled on, a primary winding current begins to flow through the primary winding W1 and the power switch transistor M1 into ground. Once a desired peak winding current has been reached, a primary-side controller (not illustrated) may then control the drive control circuit 205 to cycle off the power switch transistor M1. As used herein, "connected" refers to a direct electrical connection such as through a conducting lead whereas "coupled" refers to an electrical connection in which the connection may be through an intervening element such as a resistor or a diode.

A secondary-side controller 210 controls a synchronous rectifier (SR) switch transistor that couples between a return output terminal and the secondary winding W2. This SR control is in response to monitoring a drain-to-source voltage (VDS) across the SR switch transistor. Based upon the drain-to-source voltage VDS, the secondary-side controller detects whether the power switch transistor M1 has cycled off so that the SR switch transistor may be switched on to allow the secondary winding current to flow and charge an output voltage Vout that is supported by an output capacitor C1.

Figure 3:
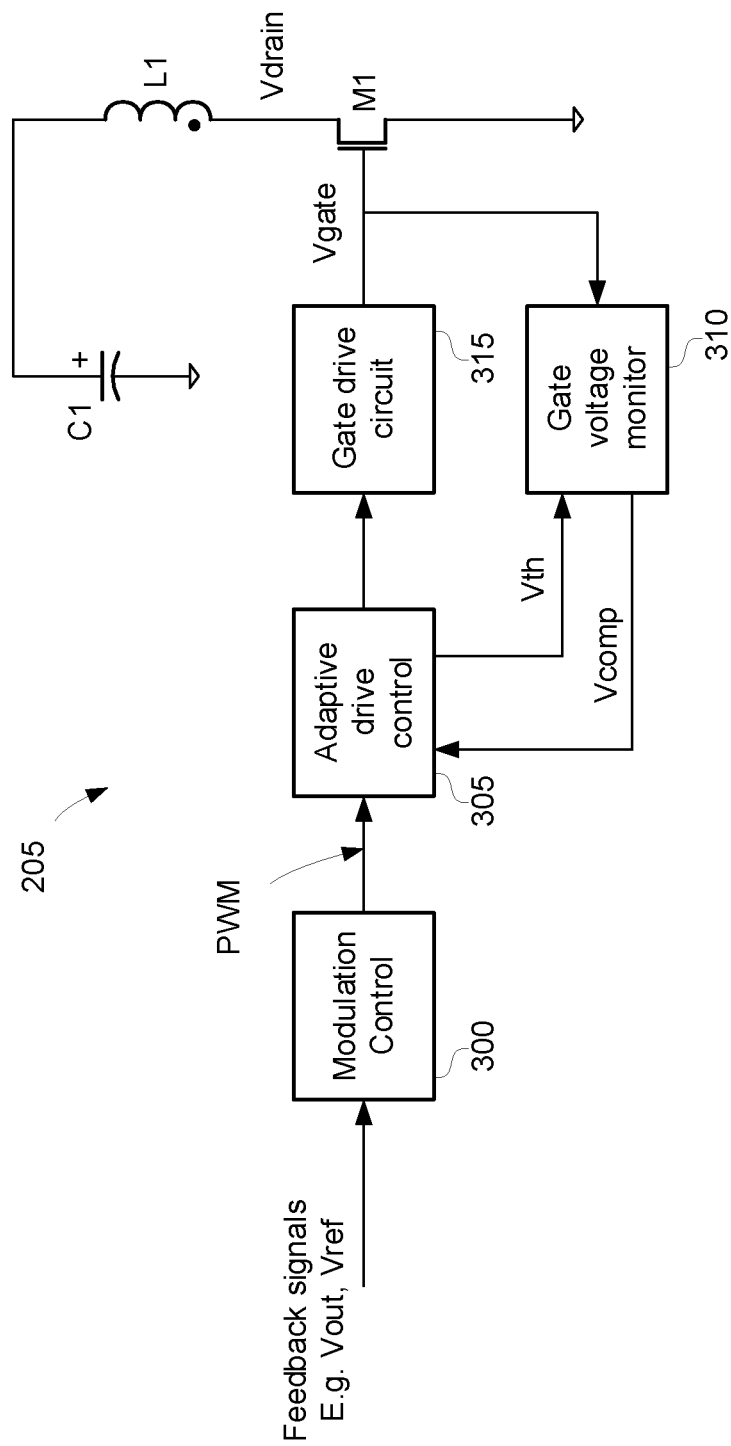
FIG. 3 illustrates an improved drive circuit in accordance with an aspect of the disclosure.

Gate drive control circuit 205 is shown in more detail in FIG. 3. For illustration clarity, the corresponding flyback converter is represented by just the primary winding L1, power switch transistor M1, and an input capacitor C1 that supports the input voltage. A modulation control circuit 300 controls gate drive control circuit 205 such as with a pulse width modulation (PWM) control signal to produce the desired on-time period for power switch transistor M1. Modulation control circuit 300 may be part of a primary-side controller or part of a secondary-side controller. If modulation control circuit 300 is located on the secondary-side of the transformer, the PWM control signal would be transmitted across a ground-isolating channel such as an opto-isolator. Regardless of where the modulation control circuit 300 is located, it generates the PWM control signal responsive to a feedback on the various operating signals such as the output voltage Vout or the input voltage Vin.

Gate drive control circuit 205 includes an adaptive drive control circuit 305, a gate drive circuit 315, and a gate voltage monitor 310. Gate voltage monitor 310 includes at least two comparators that compare the gate voltage (Vgate) of the power switch transistor to respective threshold voltages. In particular, one comparator uses a relatively low first threshold voltage Vth1 so as to assert a comparator output signal Vcomp1 when the gate voltage has risen to equal Vth1. Similarly, a second comparator uses a relatively-larger second threshold voltage Vth2 so as to assert a comparator output signal Vcomp2 when the gate voltage has risen to equal Vth2 (Vcomp1 and Vcomp2 are represented generically in FIG. 3 by a Vcomp signal). There are thus at least three periods during the power switch transistor turn-on time delay and the remaining on-time period as will be explained further herein. A first period T1 extends from the start of the turn-on time delay until the gate voltage has risen to equal Vth1. A second period T2 extends from the end of period T1 until the gate voltage has risen to equal Vth2 (Vth2 being greater than Vth1). A final period T3 extends from when the gate voltage has risen above Vth2 until the end of the on-time period. In alternative embodiments, the transition between periods T2 and T3 may be responsive to the expiration of a timer. The timer may begin timing at the initiation of period T2. Alternatively, the transition between periods T2 and T3 may be responsive to whatever event happens first: either the gate voltage rising above Vth2 or the expiration of the timer.

Gate drive circuit 315 drives the gate voltage with a drive impedance that varies depending upon which of the periods T1, T2, and T3 is active. During period T1, gate drive circuit 315 charges the gate through a relatively low drive impedance. But during period T2, gate drive circuit 315 charges the gate through a relatively high drive impedance. Finally, during period T3, gate drive circuit 315 charges the gate through another relatively low drive impedance. In some embodiments, the drive impedance during period T1 may be greater than the drive impedance during period T3. However, the drive impedance used during periods T1 and T3 may be the same in alternative embodiments. Regardless of whether the drive impedance during period T3 is less than or equal to that used during period T1, the drive impedance during period T2 may be greater than that used for either of periods T1 and T3. But note that it would be undesirable to increase the drive impedance during a critical conduction mode of operation in which a relatively large amount of power must be delivered to the load. The drive impedance in period T2 may thus be the same or even lower than that used during period T1 in such a mode of operation.

Based upon the duration of the periods T1 and T2, adaptive drive control circuit 305 adapts at least the threshold voltage Vth1 so that the turn-on period extending across periods T1 and T2 is neither too long nor too short. If the turn-on period is too long, the effective duty cycle suffers such that a power supply to a heavy load may be insufficient. Conversely, if the turn-on period is too short, the dV/dt voltage rate of change at the drain of the power switch transistor M1 is too large such that an excessive EMI is produced. In some embodiments, adaptive drive control circuit 305 may adjust the threshold voltages Vth1 and Vth2 based upon a ratio of T1/T2 and T2/T3. For example, adaptive drive control circuit 305 may include a counter that is clocked by a clock signal to provide a count in each period T1 and T2 that represents a duration of the period. The ratio T1/T2 may thus be the ratio of the count determined in period T1 to the count determined in period T2. Similarly, the ratio T2/T3 may be the ratio of the count determined in period T2 to a count determined in period T3. In addition, the threshold voltages may also be adapted responsive to a ratio T1/T3.

Figure 4:
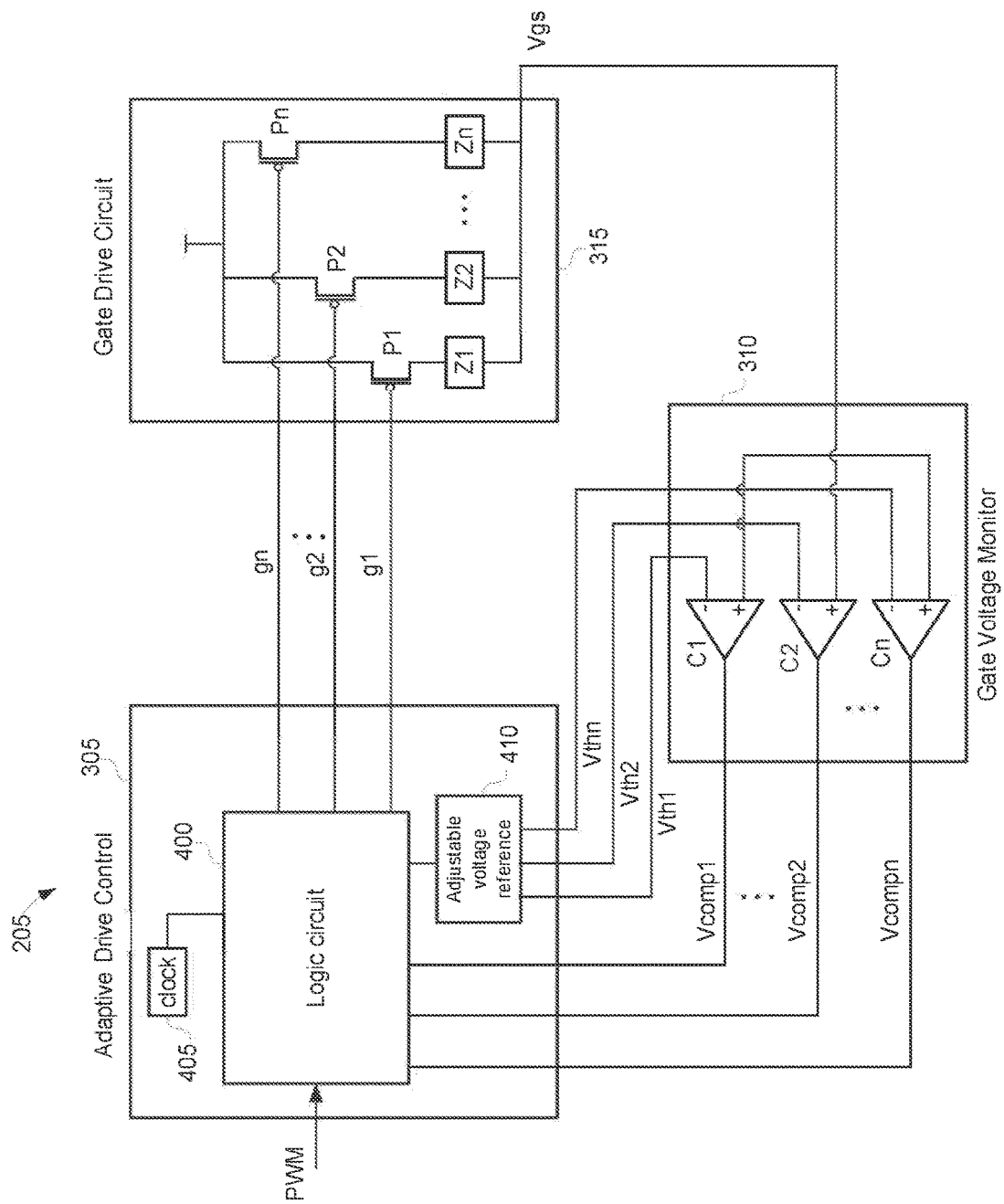
FIG. 4 illustrates additional details for the improved drive circuit of FIG. 3 in accordance with an aspect of the disclosure.

Gate drive control circuit 205 is shown in more detail in FIG. 4. Gate drive circuit 315 includes a plurality of n PMOS transistors ranging from a first PMOS transistor P1 to an nth transistor Pn, n being a positive plural integer. Each PMOS transistor has its source connected to a power supply voltage rail and a drain connected through a corresponding resistance to the gate of the power switch transistor M1. For example, transistor P1 has its drain couple to the power switch transistor gate through a resistance Z1, transistor P2 has its drain couple to the power switch transistor gate through a resistance Z2, and so on such that the nth transistor Pn has its drain couple through a resistance Zn to the power switch transistor gate. In some embodiments, the resistors may be conceptual in that they would be provided by the on-resistance of the respective transistor. Alternatively, the resistors may be external to the transistors.

To produce a low drive impedance, adaptive drive control circuit 305 may switch on each (or most) of the transistors P1 through Pn. The drive impedance increases as fewer and fewer of the transistors P1 through Pn are switched on. To control the drive impedance depending upon whether period T1, T2, or T3 is active, adaptive drive control circuit 305 may include a logic circuit 400. Logic circuit 400 may comprise a state machine, a microcontroller, or a microprocessor. During operation, logic circuit 400 responds to the PWM control signal to then switch on the power switch transistor M1 for the desired on-time period. For a large pulse width, the on-time period is relatively long whereas it is shorter for smaller pulse widths. The beginning of the on-time period may be coordinated by a clock signal from a clock 405. Logic circuit 400 controls which of the transistors P1 through Pn is switched on through a corresponding gate drive signal g1 through gn. If a gate drive signal is charged to a power supply voltage, the corresponding transistor is off. When logic circuit 400 grounds a drive signal, the corresponding transistor is switched on. In alternative embodiments, current sources may be used to control the impedance drive level during the on-time period for the power switch transistor M1.

To detect the end of period T1, gate voltage monitor 310 includes a first comparator C1 that compares the power switch transistor gate voltage to the first threshold voltage Vth1. When the gate voltage has risen to equal Vth1, comparator C1 asserts an output signal Vcomp1. Logic circuit 400 may also be configured to form a timer such as timed by the clock signal from clock source 405 to time a maximum duration period. An expiration of the maximum duration period triggers an end to period T2 so that once the maximum duration period is timed-out by this timing, logic circuit 400 commands for a transition from period T2 to period T3. Alternatively (or in conjunction with the timer), a second comparator C2 compares the power switch transistor gate voltage to the second threshold voltage Vth2 to determine an end to period T2. In some embodiments, the end of period T2 may be determined by the expiration of the maximum duration period set by the timer or by the gate voltage exceeding Vth2, whichever event occurs first. When the gate voltage has risen to equal Vth2, comparator C2 asserts an output signal Vcomp2. To add additional characterization of the gate voltage waveform, gate voltage monitor 310 may include additional comparators. For example, gate voltage monitor 310 may include a plurality of n comparators ranging from comparator C1 to an nth comparator Cn producing an nth comparator output signal Vcompn. Each comparator compares the gate voltage to its own threshold voltage to then assert its own comparator output signal. In this fashion, logic circuit 400 may more finely sample the gate voltage waveform for the power switch transistor M1 to then adjust the durations of the T1 and T2 periods or portions accordingly. To make the adjustment, logic circuit 400 may include a counter that counts responsive to a clock signal such as from clock 405. The count in each period is thus representative of the duration of each period. Logic circuit 400 may then calculate a ratio T1/T2, T2/T3, and/or T1/T3 as discussed previously. Based upon the durations of the periods T1, T2, and T3, logic circuit 400 commands an adjustable voltage reference 410 to adjust the threshold voltages to the comparators.

As known in the MOSFET arts, a Miller plateau period occurs after the gate-to-source voltage for the power switch transistor M1 has reached the transistor threshold voltage. The drain voltage then begins to fall due to the channel conduction, which tends to pull the gate voltage lower due to the gate-to-drain parasitic capacitance of the power switch transistor M1. The gate-to-drain parasitic capacitance is highly non-linear such that it is relatively small as the drain voltage begins to fall and increases in magnitude as the drain voltage approaches ground. The net result is that the gate voltage is relatively constant during the Miller plateau period, which ends once the gate-to-drain capacitance is discharged. However, due to the non-linearity of the gate-to-drain parasitic capacitance, the drain voltage may be substantially discharged well before the end of the Miller plateau period. It is thus beneficial to transition from period T2 to period T3 before the end of the Miller plateau period. The use of a timer to trigger the end of the period T2 is thus advantageous in increasing the switching speed.

Consider the advantages of the improved gate drive control disclosed herein as compared to the conventional use of a comparison of the gate voltage to a threshold voltage to trigger the transition from an initial period of relatively-high drive resistance to a final period of relatively-low drive resistance. Such a comparison must wait until the Miller plateau period has ended as the gate voltage is relatively constant during the Miller plateau period and thus will not rise above the conventional fixed threshold voltage until the Miller plateau period has ended. But as noted earlier, the bulk of the drain voltage drop occurs during an initial portion of the Miller plateau period due to the non-linearity of the gate-to-drain parasitic capacitance. It is this portion of rapid change of the drain voltage that should be controlled so that excessive EMI is not generated. But the drain voltage is changing relatively slowly during the final portion of the Miller plateau period since the drain voltage has already been substantially discharged during the initial portion. The use of a timer is thus quite advantageous in triggering a transition from period T2 to period T3 with regard to increasing switching speed yet still reducing EMI.

Figure 5:
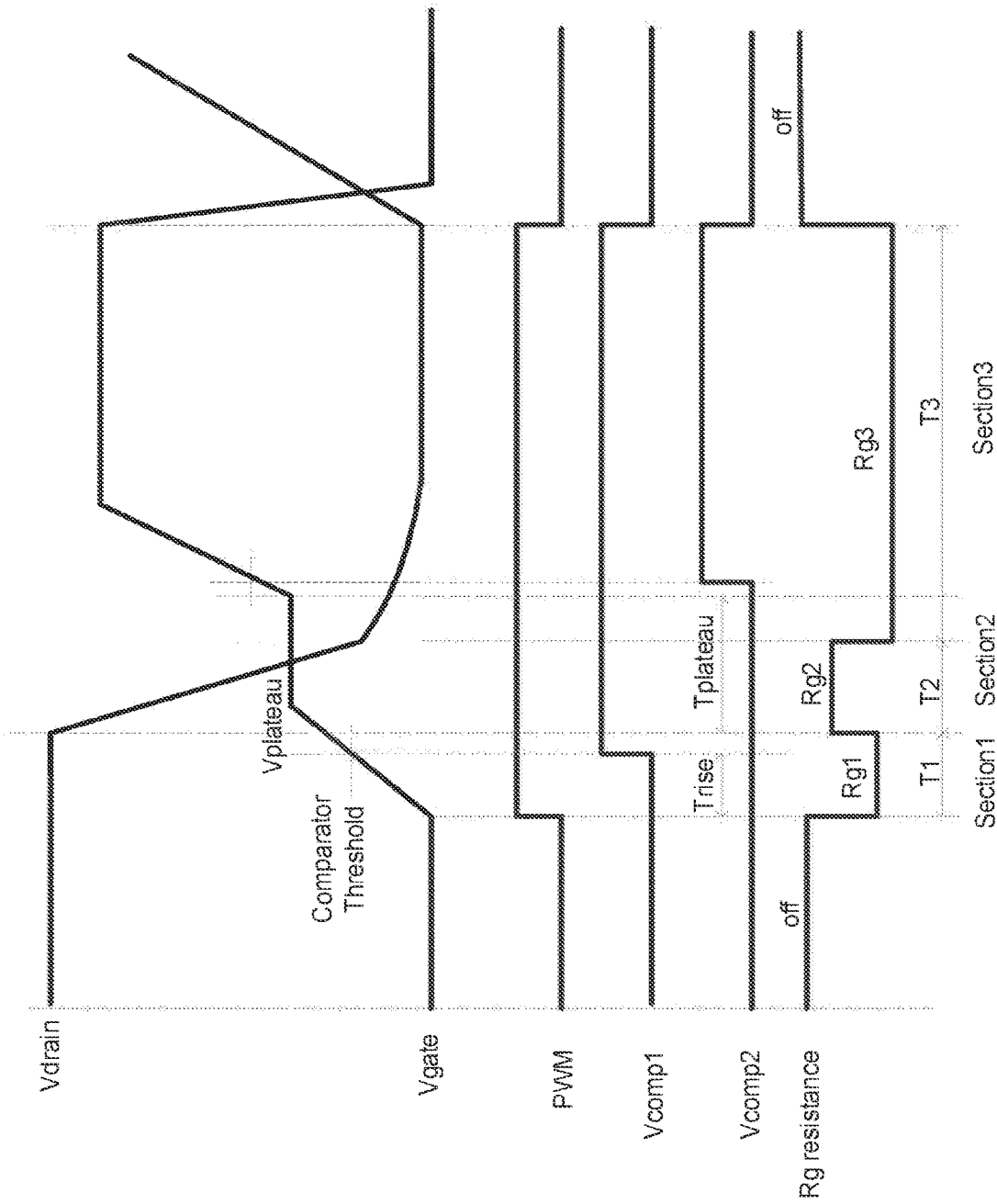
FIG. 5 illustrates some operating waveforms for the improved drive circuit of FIG. 4.

Some operating waveforms for an example gate drive control circuit are shown in FIG. 5. Prior to the beginning of period T1, the gate voltage Vgate of the power switch transistor M1 is grounded so that the power switch transistor M1 is off. The drain voltage Vdrain of the power switch transistor is equal to the input voltage at this time (assuming a discontinuous conduction mode of operation in which the power switch transistor cycling is sufficiently slow such that the resonant oscillation of the drain voltage has subsided prior to the start of the period T1). To initiate the period T1, the pulse width modulation command PWM is asserted. The gate voltage Vgate then begins to rise relatively rapidly during the period T1 as the drive resistance Rg1 is relatively low. The gate voltage then rises to the first threshold voltage Vth1 such that the output signal Vcomp1 of first comparator C1 is asserted. The crossing of the first threshold voltage Vth1 initiates the start of period T2 during which the drive resistance Rg2 may be relatively high. As discussed previously, the adaptation of the first threshold voltage is such that the Miller plateau (Vplateau) begins during period T2. The timer then expires which triggers an end to period T2 before the end of the Miller plateau period. In period T3, the gate voltage then begins to rise rapidly again to cross the second threshold voltage Vth2 once the Miller plateau period has ended. During period T3, a drive resistance Rg3 is relatively low. Period T3 continues until the power switch transistor on-time period ends. Referring again to FIG. 4, it will be appreciated that gate drive circuit 315 may include a pull-down transistor (not illustrated) that is switched on to discharge the power switch transistor gate to end the power switch transistor on-time period.

As shown in FIG. 5, the three drive resistances Rg1, Rg2, and Rg3 may all be different. During some modes of operation such as during a discontinuous conduction mode, Rg2 may be higher than Rg1 and Rg3. In some embodiments, Rg1 may be greater than Rg3 but less than Rg2. The resulting adaptive control of the gate drive of the power switch transistor M1 is quite advantageous as the effective duty cycle is increased due to the use of period T1 to get the channel opened relatively. In addition, the period T2 need not extend over the entire Miller plateau period yet reduced EMI is still achieved. Moreover, the threshold adaption ensures that various process corners and operating conditions will all have an optimized gate drive.

Those of some skill in this art will by now appreciate that many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A gate drive control circuit for a power switch transistor in a switching power converter, comprising:
   a gate drive circuit configured to charge a gate of the power switch transistor through a variable gate drive resistance;
   an adaptive drive control circuit configured to command the gate drive circuit to use a first gate drive resistance during a first portion of a power switch transistor on-time period, a second gate drive resistance during a second portion of the power switch transistor on-time period, and a third gate drive resistance during a third portion of the power switch transistor on-time period; and
   a gate voltage monitor configured to monitor a gate voltage of the power switch transistor, wherein the adaptive drive control circuit is further configured to end the first portion of the power switch transistor on-time period and transition to the second portion of the power switch transistor on-time period responsive to a comparison of the gate voltage of the power switch transistor to a first threshold voltage by the gate voltage monitor.

2. The gate drive control circuit of claim 1, wherein the gate voltage monitor comprises:
   a first comparator configured to compare the gate voltage of the power switch transistor to the first threshold voltage, wherein the adaptive drive control circuit is further configured to command the gate drive circuit to use the second gate drive resistance responsive to an assertion of an output signal from the first comparator, and wherein the second gate drive resistance is greater than the first gate drive resistance.

3. The gate drive control circuit of claim 2, wherein the gate voltage monitor further comprises:
   a second comparator configured to compare the gate voltage of the power switch transistor to a second threshold voltage.

4. The gate drive control circuit of claim 1, wherein the adaptive gate drive control circuit is further configured to begin timing a maximum duration period at an initiation of the second portion of the power switch transistor on-time period and to trigger a transition from the second portion of the power switch transistor on-time period to the third portion of the power switch transistor on-time period responsive to an expiration of the maximum duration period.

5. The gate drive control circuit of claim 4, wherein the adaptive drive control circuit is further configured to adapt the first threshold voltage responsive to a duration of the first portion of the power switch transistor on-time period and responsive to a duration of a second portion of the power switch transistor on-time period.

6. The gate drive control circuit of claim 4, wherein the maximum duration period is less than a duration of a Miller plateau period for a gate voltage of the power switch transistor.

7. The gate drive control circuit of claim 6, wherein the adaptive drive control circuit is further configured to adapt the first threshold voltage and a second threshold voltage so that the first threshold voltage is less than a Miller plateau value of the gate voltage of the power switch transistor and so that the second threshold voltage is greater than the Miller plateau value.

8. The gate drive control circuit of claim 1,
   wherein the gate drive circuit includes a plurality of transistors coupled between the gate of the power switch transistor and a power supply node, wherein the adaptive drive control circuit comprises a logic circuit configured to command a first number of transistors in the plurality of transistors to switch on during the first portion of the power switch transistor on-time period and to command a second number of transistors in the plurality of transistors to switch on during the second portion of the power switch transistor on-time period.

9. The gate drive control circuit of claim 8, wherein the first number is greater than the second number.

10. The gate drive control circuit of claim 8, wherein each transistor in the plurality of transistors couples to the gate of the power switch transistor through a corresponding resistor.

11. A method of adapting a gate drive resistance for a power switch transistor in a switching power converter, comprising:
during an initial portion of a power switch transistor on-time period while a gate voltage of the power switch transistor is less than a first threshold voltage, charging a gate of the power switch transistor through a first resistance;
initiating a timing of a maximum delay period responsive to the gate voltage of the power switch transistor being greater than the first threshold voltage;
during a second portion of the power switch transistor on-time period prior to an expiration of the maximum delay period, charging the gate of the power switch transistor through a second resistance.

12. The method of claim 11, further comprising:
responsive to an expiration of the maximum delay period, charging the gate of the power switch transistor through a third resistance during a third portion of the power switch transistor on-time period.

13. The method of claim 12, wherein the third resistance is less than the second resistance.

14. The method of claim 11, further comprising:
adapting the first threshold voltage so that a Miller plateau value of the gate voltage of the power switch transistor is greater than the first threshold voltage.

15. The method of claim 11, further comprising:
discharging the gate voltage of the power switch transistor at an end of the power switch transistor on-time period.

16. A switching power converter, comprising:
an inductor;
a power switch transistor connected to the inductor; and
a gate drive control circuit configured to: charge a gate of the power switch transistor through a first resistance during a first portion of an on-time period for the power switch transistor, charge the gate of the power switch transistor through a second resistance during a second portion of the on-time period, and charge the gate of the power switch transistor through a third resistance during a third portion of the on-time period, wherein the second resistance is greater than the third resistance, wherein the gate drive control circuit comprises a first comparator configured to compare a gate voltage of the power switch transistor to a first threshold voltage; and a timer for timing a maximum duration period responsive to an initiation of the second portion of the on-time period.

17. The switching power converter of claim 16, wherein the gate drive control circuit further comprises a logic circuit configured to select the first resistance during the first portion of the on-time period while an output signal from the first comparator indicates that the gate voltage of the power switch transistor is less than the first threshold voltage and to select for the second resistance during the second portion of the on-time period and prior to an expiration of the maximum duration period.

18. The switching power converter of claim 17, wherein the logic circuit is further configured to select for the third resistance during the third portion of the on-time period responsive to an expiration of the maximum duration period.

* * * * *